United States Patent
Hara et al.

(10) Patent No.: US 6,566,754 B2
(45) Date of Patent: May 20, 2003

(54) POLYCRYSTALLINE SEMICONDUCTOR DEVICE AND ITS MANUFACTURE METHOD

(75) Inventors: Akito Hara, Kawasaki (JP); Kuninori Kitahara, Matsue (JP); Satoshi Murakami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/909,696

(22) Filed: Jul. 20, 2001

(65) Prior Publication Data

US 2001/0046755 A1 Nov. 29, 2001

Related U.S. Application Data

(62) Division of application No. 09/376,827, filed on Aug. 18, 1999.

(51) Int. Cl.[7] ............................................... H01L 23/48
(52) U.S. Cl. ...................................... 257/755; 438/166
(58) Field of Search ................................ 438/166, 487, 438/308, 149, 535, 795; 257/755, 65, 51, 57, 617

(56) References Cited

U.S. PATENT DOCUMENTS

| | | | | |
|---|---|---|---|---|
| 4,977,098 A | * | 12/1990 | Yu et al. ........................ 437/31 |
| 5,190,613 A | * | 3/1993 | Yamagata .................... 156/600 |
| 5,313,076 A | * | 5/1994 | Yamazaki et al. ............. 257/66 |
| 5,581,092 A | * | 12/1996 | Takemura .................... 257/65 |
| 5,622,607 A | * | 4/1997 | Yamazaki et al. ...... 204/192.15 |
| 5,744,818 A | * | 4/1998 | Yamazaki et al. ............. 257/57 |
| 5,766,989 A | * | 6/1998 | Maegawa et al. ............ 438/166 |
| 5,773,309 A | * | 6/1998 | Weiner ......................... 437/21 |
| 5,797,999 A | * | 8/1998 | Sannomiya et al. ......... 136/258 |
| 5,970,369 A | | 10/1999 | Hara et al. |
| 6,071,765 A | * | 6/2000 | Noguchi et al. ............. 438/166 |
| 6,093,934 A | * | 7/2000 | Yamazaki et al. ............. 257/51 |
| 6,184,068 B1 | | 2/2001 | Ohtani et al. |
| 6,246,070 B1 | * | 6/2001 | Yamazaki et al. ............. 257/40 |

FOREIGN PATENT DOCUMENTS

| | | |
|---|---|---|
| JP | 61-085815 | 5/1986 |
| JP | 63-088826 | 4/1988 |
| JP | 05-082442 | 4/1993 |
| JP | 09-293680 | 11/1997 |
| JP | 09-312258 | 12/1997 |
| JP | 10-092745 | 4/1998 |

OTHER PUBLICATIONS

New Approach to Form poly–Si by Low, Wide Energy of Laser Irradiation; Hara et al.; The Japan Society of Applied Physics Digest of Technical Papers; pp. 59–62; 1997.

Growth Technology of High Performance Poly–Silicon for TFT–LCD; Fujitsu, vol. 49, No. 3, pp. 191–195, May 1998.

* cited by examiner

*Primary Examiner*—Hoai Ho
*Assistant Examiner*—David Vu
(74) *Attorney, Agent, or Firm*—Greer, Burns & Crain, Ltd.

(57) ABSTRACT

A method of manufacturing a semiconductor device having a polycrystalline semiconductor layer includes the steps of: preparing a base substrate; forming a first semiconductor layer on a surface of the base substrate; forming a first polycrystalline semiconductor layer by applying an energy beam to the first semiconductor layer; etching a surface layer of the first polycrystalline semiconductor layer; and after the etching process, forming a second semiconductor layer on a surface of the first polycrystalline semiconductor layer without exposing the surface of the first polycrystalline semiconductor layer to an atmospheric air. The final polycrystalline semiconductor layer has a high film quality.

12 Claims, 8 Drawing Sheets

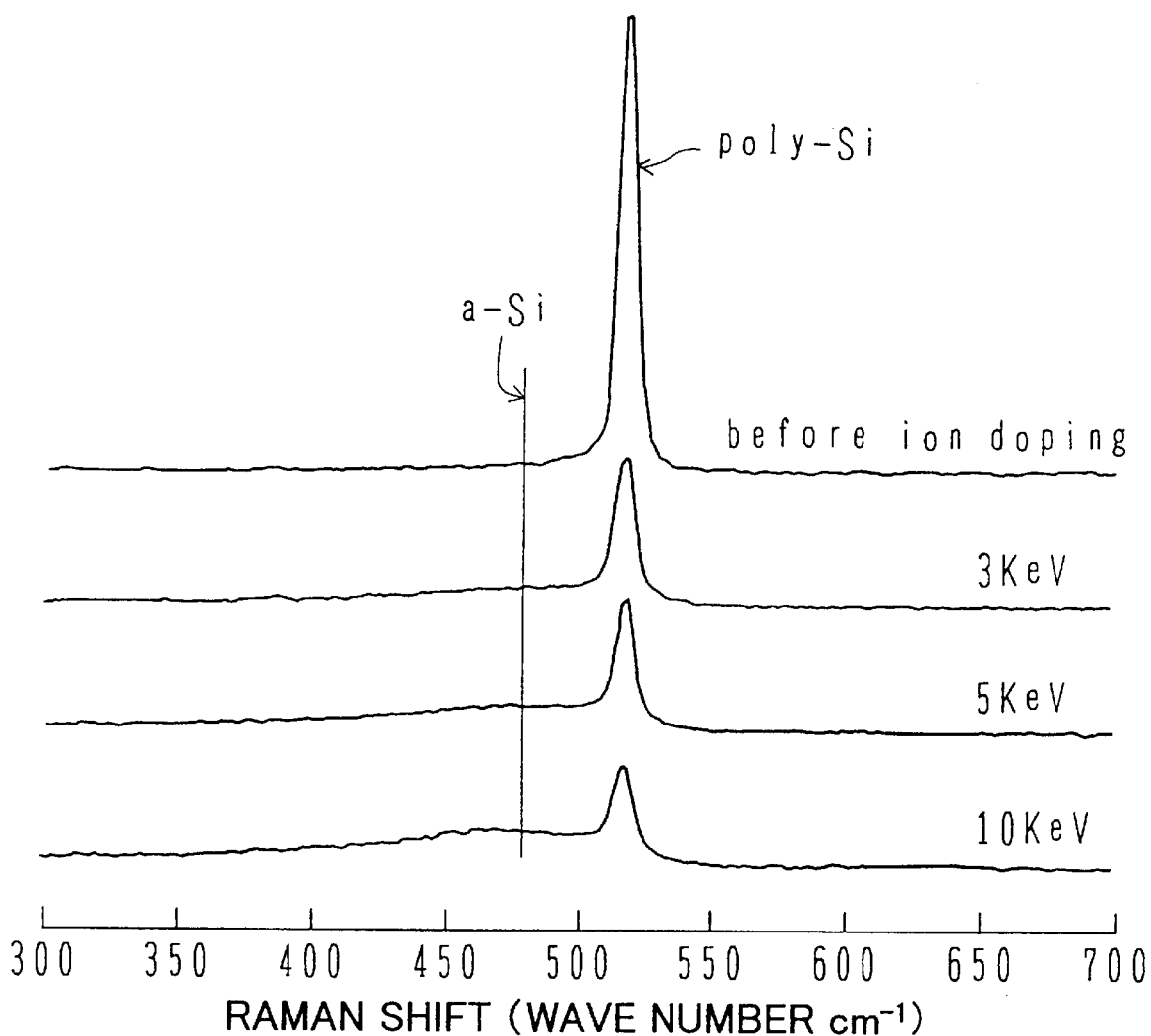

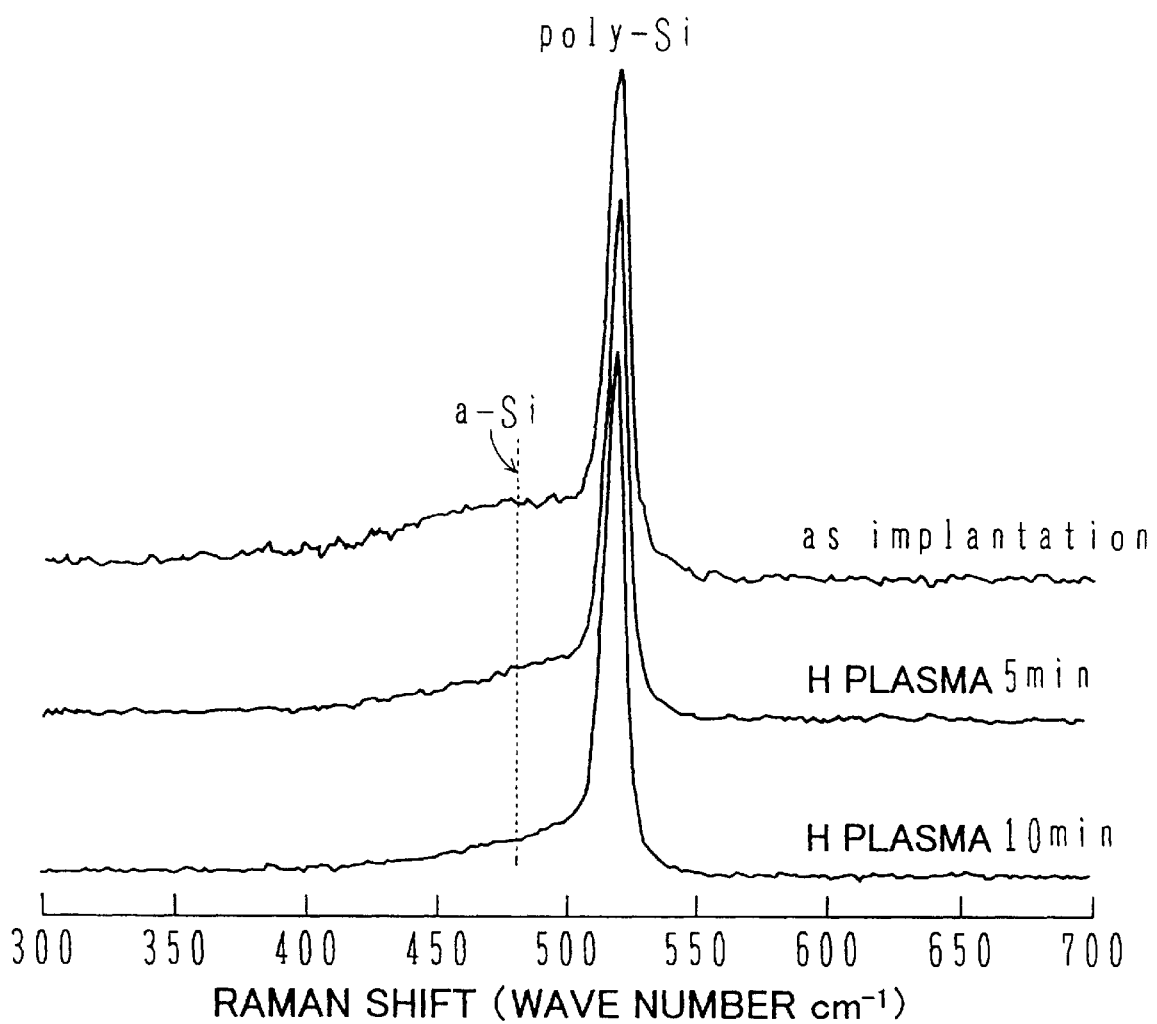

POLYCRYSTALLINE SEMICONDUCTOR DEVICE AND ITS MANUFACTURE METHOD

This is a divisional of application Ser. No. 09/376,827, filed Aug. 18, 1999.

This application is based on Japanese Patent Application HEI 10-329764, filed on Nov. 19, 1998, the entire contents of which are incorporated herein by reference.

BACKGROUND OF THE INVENTION a) Field of the Invention

The present invention relates to a semiconductor device and its manufacture method, and more particularly to a semiconductor device having a polycrystalline layer and its manufacture method.

b) Description of the Related Art

Polysilicon layers are used as various elements of various types of semiconductor devices. Following methods are known as manufacture methods for polysilicon layers.

(1) After an amorphous silicon layer is formed, this layer is subjected to a heat treatment for about 50 hours at a temperature of about 600° C. to polycrystallize it. With this method, crystal growth nuclei are formed in the amorphous silicon layer at an earlier stage of the heat treatment, and crystals are grown from these growth nuclei to polycrystallize the amorphous silicon layer.

(2) After an amorphous silicon layer is formed, an energy beam such as a laser beam is applied to this layer to melt it and thereafter cool it. During the cooling process, the molten silicon layer is crystallized and a polysilicon layer is formed.

(3) A silicon layer is formed on a base substrate through chemical vapor deposition or physical vapor deposition at a temperature of about 600° C. Since the substrate is maintained at a sufficiently high temperature, a grown silicon layer becomes a polysilicon layer.

A method of forming various types of semiconductor devices by forming a silicon layer on a glass substrate has been adopted for liquid crystal display devices and solar cells. A polycrystallized silicon layer can improve the performance of a semiconductor device more than a silicon layer of an amorphous phase. Generally, a glass substrate cannot resist a temperature higher than 600° C., and deformation or the like occurs at such a high temperature.

The above-described method (1) requires a heat treatment temperature of about 600° C. A number of stacking faults and twin crystals are formed in a polysilicon layer grown on a glass substrate and it is difficult to form a polysilicon layer having good crystallinity.

The above-described method (3) requires a temperature of 600° C. or higher when the film is formed. Even if a polysilicon layer is grown on a glass substrate, crystallinity is not sufficient similar to the method (1) and it is difficult to form crystals providing a high mobility of carriers.

A remaining possibility of growing a polysilicon layer on a glass substrate is the above-described method (2). A polysilicon layer formed by utilizing laser annealing has high quality. However, the conditions of forming high quality polysilicon are restricted and very narrow. A method capable of stably forming a high quality polysilicon layer has been desired.

SUMMARY OF THE INVENTION

It is an object of the present invention to provide a method capable of manufacturing a semiconductor device with a high quality polycrystalline layer.

It is another object of the present invention to provide a semiconductor device with a high quality polycrystalline layer formed on a base substrate such as a glass substrate.

According to one aspect of the present invention, there is provided a method of manufacturing a semiconductor device, comprising the steps of: preparing a base substrate; forming a first semiconductor layer on a surface of the base substrate; forming a first polycrystalline semiconductor layer by applying an energy beam to the first semiconductor layer; etching a surface layer of the first polycrystalline semiconductor layer; and after the etching step, forming a second semiconductor layer on a surface of the first polycrystalline semiconductor layer without exposing the surface of the first polycrystalline semiconductor layer to an atmospheric or environmental air.

According to another aspect of the present invention, there is provided a semiconductor device comprising: a base substrate including a glass substrate; and a polycrystalline semiconductor layer formed on the base substrate, the polycrystalline semiconductor layer having a number of grain boundaries extending from a lower surface to an upper surface of the layer and a peak of an atmospheric impurity concentration distributing in a whole area of the layer at a predetermined depth.

A polycrystalline semiconductor layer having a large crystal grain size can be formed by applying an energy beam to a semiconductor layer having a thickness of a predetermined value or smaller. The surface layer of this polycrystalline semiconductor layer is etched to expose a clean crystal surface and another semiconductor layer is formed on this clean crystal surface. By polycrystallizing the other semiconductor layer, a polycrystalline semiconductor layer can be formed which is epitaxially continuous with the underlying polycrystalline semiconductor layer.

A polycrystalline semiconductor layer made of a lamination of a plurality of semiconductor layers formed in the above manner has a crystal orientation continuous from the lower layer to the upper layer and a peak of an atmospheric impurity concentration near at interfaces between the layers.

A polycrystalline semiconductor layer of high quality can be formed on the base substrate in the manner described above. For example, a polysilicon layer having a high mobility of carriers can be formed on a glass substrate. Crystallinity can be expected to be improved, and semiconductor elements can be formed by using such a polycrystalline semiconductor layer. For example, a liquid crystal display device having integrally formed peripheral circuits and a system-on-panel semiconductor device can be formed.

BRIEF DESCRIPTION OF THE DRAWINGS

FIG. 2 is a graph showing the measurement results of Raman scattering of polysilicon layers whose surfaces were amorphized by doping ions.

FIG. 3 is a graph showing the measurement results of Raman scattering of polysilicon layers with amorphous surfaces after H plasma processes were executed.

DETAILED DESCRIPTION OF THE PREFERRED EMBODIMENTS

Embodiments of the invention will be described with reference to the accompanying drawings. Although two silicon layers are laminated to form a lamination film in the following, this is only illustrative and not limitative. The number of layers is not limited only to two, but three or more layers may be used. Semiconductor is not limited only to silicon. For example, a Ge layer, an SiGe alloy layer and the like may also be formed.

Figure 1A:
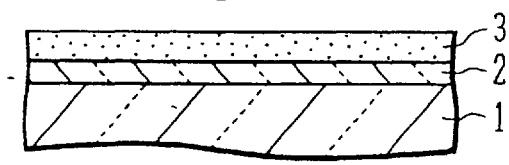
FIGS. 1A to 1H are cross sectional views of a substrate illustrating processes of forming a polysilicon layer.

As shown in FIG. 1A, on the surface of a glass substrate 1 having a thickness of about 0.7 mm, an $SiO_2$ film 2 is deposited through chemical vapor deposition (CVD), plasma enhanced chemical vapor deposition (PECVD) or the like. For example, an $SiO_2$ film having a thickness of about 400 nm is deposited through PECVD. Although the glass substrate 1 is fairly flat, it is not so resistant to heat so that it is not suitable for an environment at a temperature higher than 600° C. The $SiO_2$ film 2 is a protective film for preventing impurity diffusion from the glass substrate 1.

On the glass substrate 1 having the $SiO_2$ film 2 formed on the surface thereof, an amorphous silicon film 3 is formed to a thickness of about 25 nm by PECVD. In this case, the substrate temperature is set to about 350° C. The silicon layer 3 formed by PECVD contains a large amount of hydrogen. In order to reduce hydrogen, a heat treatment is performed in a nitrogen atmosphere for about 2 hours at about 450° C.

Figure 1E:
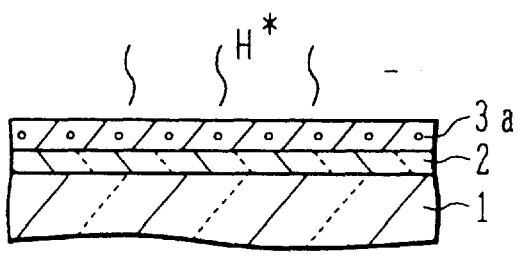
Figure 1B:
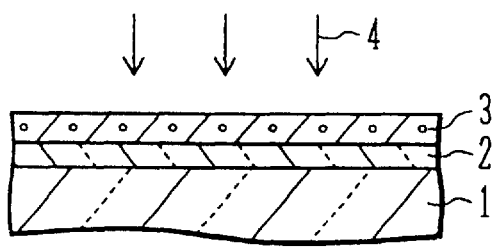

As shown in FIG. 1B, in a nitrogen atmosphere at a room temperature, xenon chloride (XeCl) pulse excimer laser is radiated to the surface of the amorphous silicon layer 3 to melt the amorphous silicon layer 3 and then cool it to form a polysilicon layer 3. For example, the excimer laser has a wavelength of 308 nm, a pulse width of 30 ns and a repetition frequency of 100 Hz. An area of 1 mm×100 mm is radiated with the laser beam at an energy density of 266 mJ/cm$^2$, for example, and the next area is radiated by moving the laser beam by 0.05 mm in the width direction. Therefore, the same area of the silicon layer is radiated with pulse laser beam twenty times.

The thickness of the Si layer 3 is set to 40 nm or thinner, or preferably to 30 nm or thinner. The Si layer 3 having such a predetermined thickness or thinner is changed to a polysilicon film having a large crystal grain size. If a laser beam having a laser energy higher than a threshold value is applied, the Si layer obtained after cooling becomes amorphous. It is therefore effective to radiate a laser beam having a laser energy just at the threshold value in order to form a polysilicon layer having a large crystal grain diameter.

It is easy to discriminate after laser radiation between a polysilicon layer and an amorphous silicon layer. For example, this discrimination can be made easily through measurements of Raman scattering, X-ray analysis, electron beam analysis, electron spin resonance, etching characteristics, transmission electron microscopes, scanning type electron microscopes or the like.

It is preferable to set the threshold value by conducting experiments of laser radiation to silicon layers under various conditions. By applying a laser beam having an energy slightly lower than the threshold energy value, a polysilicon layer having a large grain size can be formed easily.

For example, when an excimer laser beam having an energy just at the threshold value was applied to an amorphous silicon layer having a film thickness of 25 nm, a polysilicon layer having a crystal grain diameter of 400 nm was formed.

In order to form a sufficiently thick silicon layer, it is desirous to grow polysilicon layers on the polysilicon layer 3 formed in the above manner. According to the findings of earlier studies made by the present inventors, if an amorphous silicon layer deposited on a glass substrate is polycrystallized and then a next amorphous silicon layer is deposited on the polysilicon layer and polycrystallized by laser irradiation, the positions of grain boundaries of the first and second polysilicon layers become different.

According to the findings of later studies made by the present inventors, if the surface of an underlying polysilicon layer is cleaned, the positions of grain boundaries of the underlying polysilicon layer and the polysilicon layer grown on the underlying polysilicon layer are aligned.

Figure 1F:
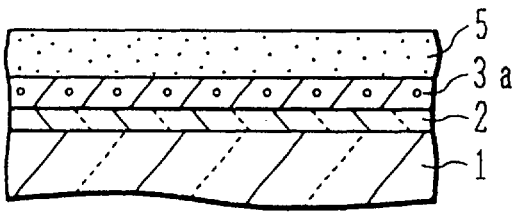
Figure 1C:
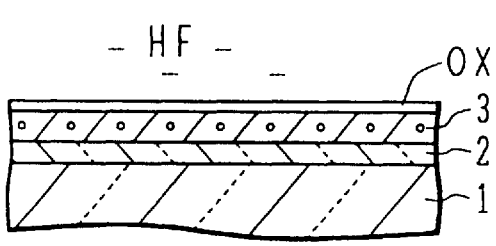

As shown in FIG. 1C, the substrate having the polycrystallized silicon layer 3 is processed in aqueous solution of hydrofluoric acid (HF). If an Si surface is exposed to the atmospheric air or contacts acid, a natural or native oxide film is formed on the Si surface. This natural oxide film OX formed on the surface can be removed to expose a clean Si surface, by processing the substrate with solution of $H_2O$+ HF. This clean Si surface is hydrophobic.

Figure 1G:
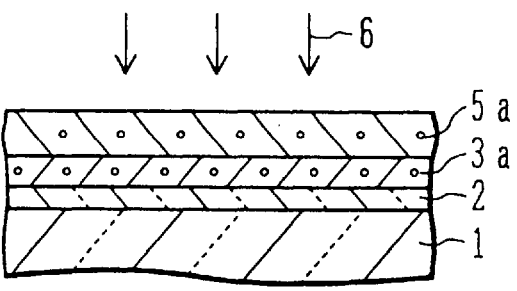
Figure 1D:
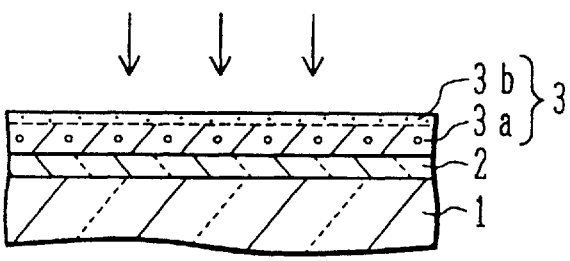
Figure 1H:
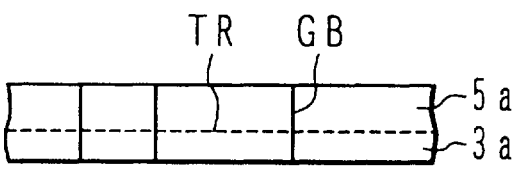
Figure 1D:
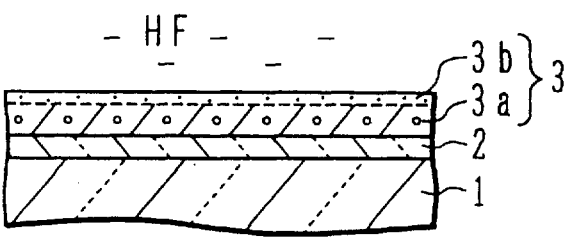

As shown in FIG. 1D, the substrate whose polysilicon layer surface was processed with aqueous solution of HF is placed in a vacuum chamber of an ion doping system and the surface layer of the polysilicon layer is amorphized by ion doping.

In our experiments, a mixture gas of phosphine ($PH_3$) and hydrogen=5:100 was used as the gas for amorphizing surface layers. An acceleration energy was varied to 3 keV, 5 keV and 10 keV. Impacts of accelerated ions changed the surface layer of the polysilicon layer 3 to an amorphous silicon layer 3b. A polysilicon layer 3a was left under the amorphous silicon layer 3b. The dose of ion doping was set to 1.5×10$^{15}$ cm$^{-2}$ at each acceleration energy.

FIG. 2 shows the measurement results of Raman scattering of semiconductor surface layers subjected to ion doping. The abscissa represents a wave number in cm$^{-1}$ and the ordinate represents a signal intensity. A peak of crystalline silicon is at a Raman shift wave number of about 520 cm$^{-1}$, and a peak of amorphous silicon is at a Raman shift wave number of about 480 cm$^{-1}$. It can be seen that as the ion acceleration energy increases, the peak amplitude of crystalline silicon lowers and the peak amplitude of amorphous silicon increases. It can be understood from these measurement results that ion doping can amorphize the surface layer of a polysilicon layer.

Although phosphine was used in the experiments as the gas for amorphizing the polysilicon surface layer, this gas contains phosphorous (P) which becomes electrically active impurities when it is introduced into silicon. In order to avoid electrically adverse effects, other gas species electrically inactive in silicon are used. For example, inert gas may be used.

For the amorphization, in addition to the above-described ion doping with mass analysis, ion doping without mass analysis, plasma ion doping, or sputtering utilizing impact of ions may be used.

Since the process shown in FIG. 1C is performed for removing the oxide film OX such as a natural oxide film possibly on the surface of the silicon layer 3, the natural oxide film, if any, formed on the surface of the silicon layer 3 is considerably thin at the ion doping process shown in FIG. 1D. At the process shown in FIG. 1D, the surface layer of the silicon layer 3, which is possibly contaminated to a large degree with atmospheric impurities, is amorphized. Amorphous silicon and polysilicon have different etching characteristics.

As shown in FIG. 1D', the substrate is again subjected to oxide removing process in aqueous solution of hydrofluoric acid (HF).

As shown in FIG. 1E, the glass substrate 1 is accommodated in a parallel plate radio frequency (RF) plasma etching system to etch the surface amorphous silicon layer 3b with hydrogen plasma. The hydrogen plasma contains a large amount of active hydrogen which etches the amorphous silicon layer. Since the etching characteristics of the polysilicon layer 3a are different from those of the amorphous silicon layer 3b, the polysilicon layer 3a is not etched so much even if it contacts active hydrogen.

FIG. 3 is a graph showing the measurement results of Raman scattering of amorphous silicon surface layers etched with hydrogen. The abscissa represents a Raman shift represented by a wave number in $cm^{-1}$, similar to FIG. 2. The Raman peak of polysilicon at a wave number of about 520 $cm^{-1}$ slightly lowers as the H plasma process continues, while the Raman peak of amorphous silicon definitely lowers as the H plasma process time is prolonged. It can be understood therefore that although an amorphous silicon layer is etched with hydrogen plasma, a polysilicon layer is not etched so much.

Without the HF process of FIG. 1D', the Raman peak of the amorphous silicon layer was not confirmed clearly even if the layer is exposed to hydrogen plasma.

As shown in FIG. 1F, after the hydrogen plasma process shown in FIG. 1E, while the silicon surface is not exposed to the atmospheric air, an amorphous silicon layer 5 is deposited on the surface of the polysilicon layer 3a subjected to the hydrogen plasma process. For example, an RF plasma etcher and an amorphous silicon film forming chamber are housed in a multi-chamber processing system capable of transporting a glass substrate always in the vacuum state. In this system, after the hydrogen plasma process, the substrate is transported to the amorphous silicon film forming chamber to form the amorphous silicon layer 5 to a thickness of about 25 nm.

Thereafter, the substrate is exposed in the atmospheric air to perform a heat treatment for about 2 hours at about 450° C. to degas hydrogen contained in the amorphous silicon layer 5.

As shown in FIG. 1G, the substrate with the amorphous silicon layer 5 from which hydrogen was degassed is transported into an excimer laser radiation chamber to radiate an XeCl pulse excimer laser beam 6 to the amorphous silicon layer 5 to transform it into a polysilicon layer 5a. This laser radiation process is executed under the conditions that although the upper amorphous silicon layer 5 is melted, the lower polysilicon layer 3a is not melted completely.

Since the surface of the underlying polysilicon layer 3a was cleaned, an oxide film hardly exists at the interface between the underlying silicon layer 3a and deposited silicon layer 5 and these layers are likely to form a continuous crystal structure. The amorphous silicon layer 5 is transformed into the polysilicon layer 5a upon radiation of the pulse excimer laser beam.

Figure 4A:
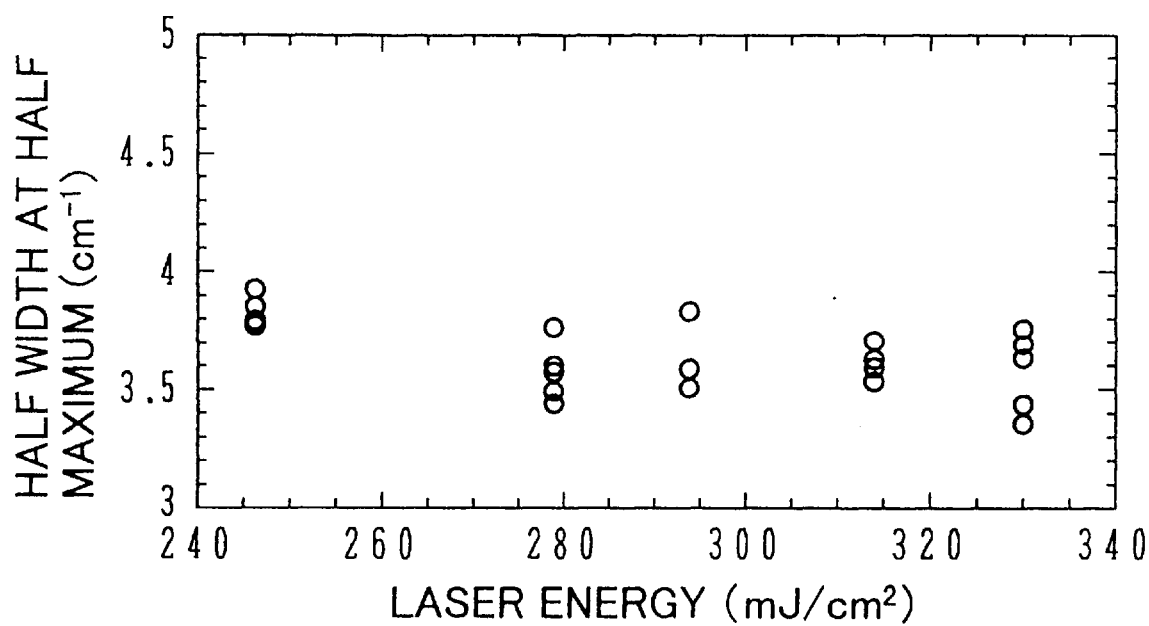
FIGS. 4A and 4B are graphs showing the measurement results of Raman scattering of silicon layers formed on surface-etched polysilicon layers and polycrystallized with pulse laser beams.
Figure 4B:
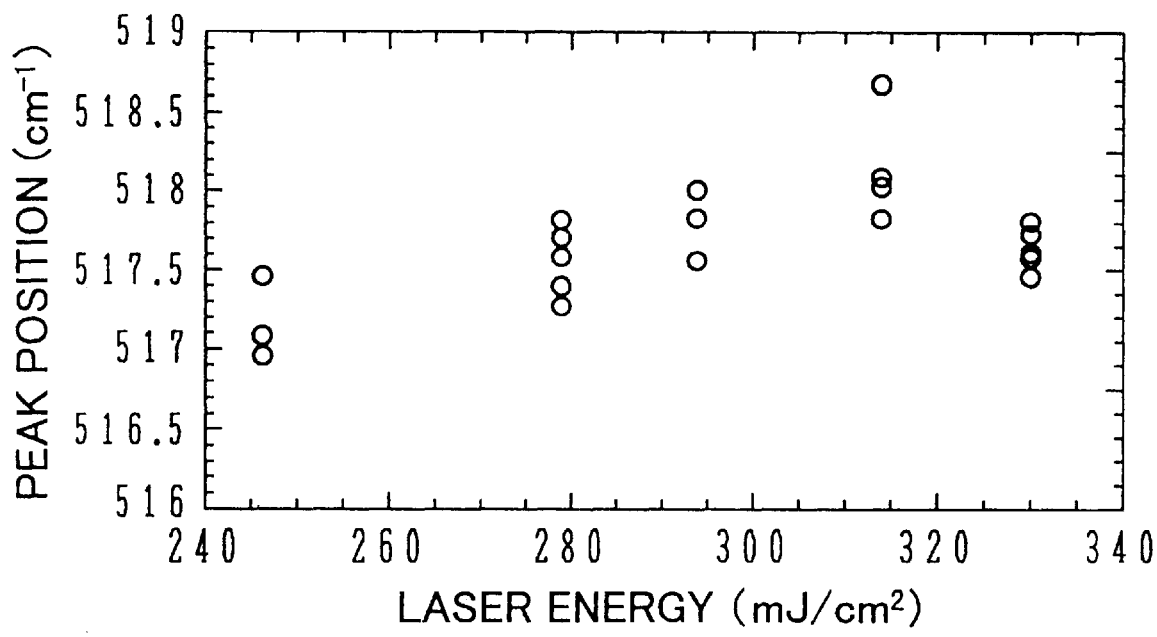

FIGS. 4A and 4B are graphs showing the measurement results of Raman scattering of polysilicon layers 5a after pulse excimer laser beams were applied thereto. FIG. 4A illustrates a relation between a radiated laser energy and a half width at half maximum of the Raman peak of polysilicon, and FIG. 4B illustrates a relation between a peak position and a radiated laser energy.

As seen from FIG. 4A, the half width at half maximum narrows as the laser energy increases and it takes generally a constant value in the region about 280 $mJ/cm^2$ or higher.

As seen from FIG. 4B, the Raman peak position of a silicon layer gradually moves toward the peak position of crystalline silicon as the laser energy increases, and it moves away from the peak position at the laser energy of 320 $mj/cm^2$ or higher.

From the measurement results of both FIGS. 4A and 4B, it can be judged that the laser energy is preferably in a range from about 280 to about 320 $mJ/cm^2$.

The melting point of polysilicon becomes nearer to that of single crystal silicon as its crystallinity becomes more similar to that of single crystal silicon, and the absorption coefficient of XeCl pulse excimer laser lowers. The underlying silicon film has good crystallinity similar to that of single crystal silicon, because the underlying silicon film is formed through laser radiation. After an amorphous silicon layer is formed on the underlying silicon layer and a pulse excimer laser beam is applied, the underlying silicon layer is not easy to be melted completely by laser radiation, whereas the surface amorphous silicon layer well absorbs the laser beam and is easily melted. The melted silicon layer contacts the underlying polysilicon layer and epitaxially grows following the crystal orientation of the underlying polysilicon layer. It is therefore conceivable that the crystal grain diameter of the polysilicon layer formed from the upper silicon layer becomes equal to that of the underlying polysilicon layer.

As described above, if a laser beam is radiated in the energy range that the upper silicon layer melts completely and the underlying polysilicon layer melts not completely, the underlying silicon crystals left unmelted serve as seed crystals from which crystal growth starts preferentially without a necessity of large super cooling. It is therefore possible to have a large crystal grain diameter. If the crystal grain diameter of the underlying polysilicon layer is made large, that of the upper polysilicon layer becomes correspondingly large.

If the underlying silicon layer melts completely, crystal growth starts from completely melted silicon. In this case, it is necessary that solution of completely melted silicon generates crystal nuclei. After a pulse laser beam is applied, a cooling speed is high so that after super cooling at about 300° C. occurs, crystal nuclei are generated. If the cooling speed of solution is high, a number of crystal nuclei are generated immediately after the solution undergoes the super cooling state of about 300° C. and a polysilicon layer having a small crystal grain diameter is formed.

Therefore, in order to form a polysilicon layer having a large crystal grain diameter, it is preferable to radiate a laser beam at an energy smaller than that at which the underlying polysilicon layer completely melts.

In summary, it is preferable to radiate a pulse laser beam at an energy at which the amorphous silicon layer to be polycrystallized can be melted completely and the underlying polysilicon layer is not completely melted. Such an energy range is considerably broad so that the conditions of the laser radiation can be set easily.

If the surface of the underlying silicon layer is not etched, it is natural to presume that atmospheric impurities (contained in the atmospheric air) are attached to the surface of the underlying silicon layer. If the next silicon layer is deposited on this contaminated surface, the impurities are confined in the silicon layer. When the upper silicon layer is melted, the impurities are dissolved in the solution and enter crystals while the solution is crystallized. Such impurities may degrade the quality of the final polysilicon layer.

Impurities attached to the surface of the underlying silicon layer may hinder the contact of the underlying silicon crystals to the solution when the upper silicon layer is melted. Therefore, removing the surface layer of the underlying silicon layer ensures the direct contact of the silicon solution to the underlying silicon layer and ensures a silicon epitaxial growth.

The crystal grain diameter of the polysilicon layer formed by the above-described embodiment method was measured with a scanning type electron microscope after the surface of the polysilicon layer was secco-etched (etched with a mixture liquid of potassium bichromate, hydrofluoric acid and water). The crystal grain diameter was in a range from 300 to 400 nm which is very large.

Figure 5A:
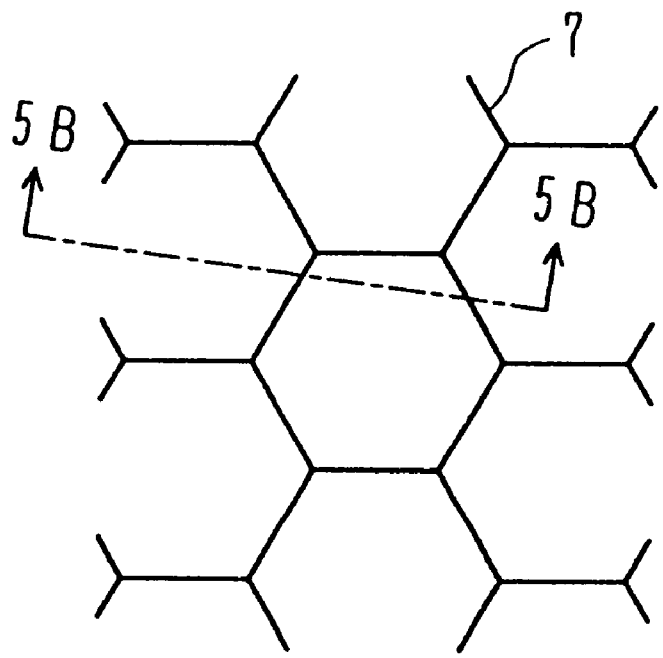
FIGS. 5A and 5B are a plan view and a cross sectional view schematically showing the structure of a laminated polysilicon layer.
Figure 5B:
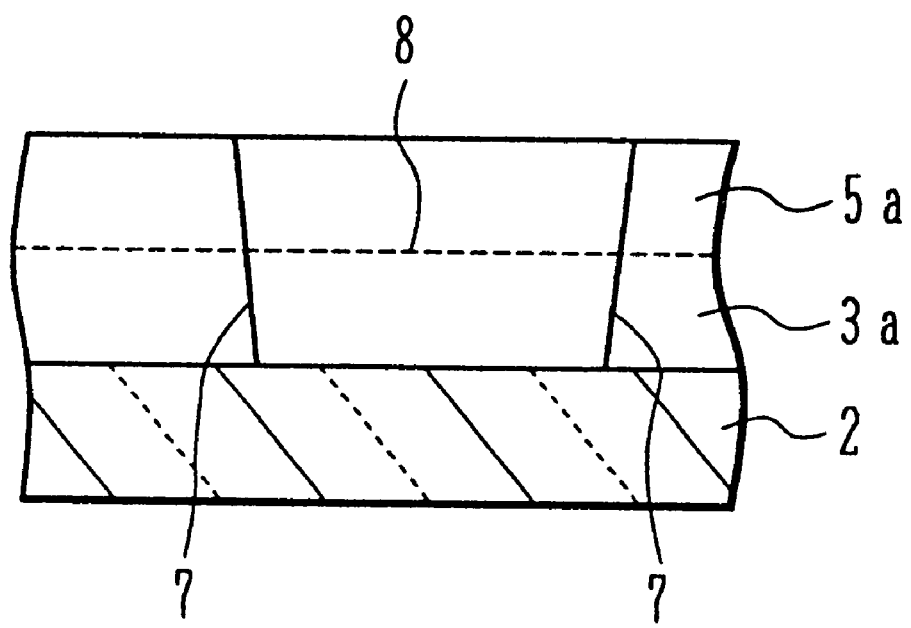

FIGS. 5A and 5B schematically show the structure of a silicon layer formed by the embodiment method. FIG. 5A is a schematic top view and FIG. 5B is a schematic cross sectional view.

As shown in FIG. 5A, the polysilicon layer has a number of grain boundaries 7 each being generally linear. Although the shape of the grain is represented by a hexagon, other shapes also exist, such as a pentagon, a heptagon and an octagon. The shapes of these polygons change irregularly and a shape of a polygon whose side becomes depressed also exists.

FIG. 5B is a schematic cross sectional view taken along line 5B—5B in FIG. 5A. In the lamination of a first polysilicon layer 3a and a second polysilicon layer 5a formed on the surface of an $SiO_2$ film 2, the grain boundaries 7 are formed continuously. There is however a peak 8 of atmospheric impurities not removed completely, near at the interface between the first and second polysilicon layers 3a and 5a.

A mobility of a final polysilicon layer was measured by utilizing the Hall effect. A Hall mobility of electrons in the polysilicon layer having a carrier concentration of $2\times10^{19}$ cm$^{-3}$ was 28 cm$^2$/Vsec. This value is sufficiently high for the polysilicon layer having the carrier concentration of $2\times10^{19}$ cm$^{-3}$, and indicates that the crystallinity is excellent.

In the above embodiment, electrically active impurities P are used for amorphizing the surface of a polysilicon layer. Other experiments were made by amorphizing the surface of a polysilicon layer with electrically inactive Ar. Instead of P, Ar was accelerated at an acceleration energy of 3 keV and applied to the surface of an underlying polysilicon layer to amorphize the surface layer thereof. Next, the substrate was exposed to hydrogen plasma after HF treatment to remove the amorphous surface layer.

A process of etching the amorphous surface layer of the underlying polysilicon layer with hydrogen plasma and a process of forming an upper amorphous silicon layer were performed always in the vacuum state similar to the above-described embodiment. Thereafter, the substrate was heated to 300° C. and an excimer laser beam was applied to polycrystallize the amorphous silicon layer.

The final polysilicon layer was secco-etched to measure the crystal grain diameter with an SEM. The average crystal grain diameter was 300 to 400 nm. The dose of Ar was set to $3\times10^{13}$ cm$^{-3}$ which is about $\frac{1}{100}$ when phosphorous ions were doped.

Even a small amount of ion doping can amorphize the surface layer of the underlying polysilicon layer. This is because the mass of Ar is considerably heavier than that of P. If the dose is reduced, the amount of amorphizing ions (Ar) left in crystals as residual impurities can be reduced. It is therefore expected that impurity diffusion can be suppressed and the mobility can be increased.

Next, processes of manufacturing a semiconductor device by using a polysilicon layer will be described. A MOS transistor is used as a typical example of semiconductor devices in the following description. It is apparent to those skilled in the art that other semiconductor devices can be manufactured by similar methods.

With reference to FIGS. 6A to 6G, a manufacture method for a thin film transistor applying a method of forming a silicon film according to the above or other embodiment will be described.

Figure 6A:
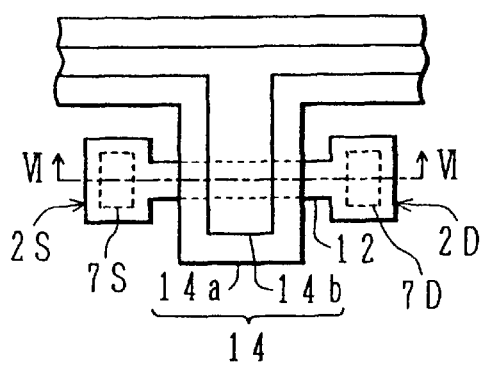
FIGS. 6A to 6G are cross sectional views schematically illustrating processes of forming a semiconductor device by using laminated polysilicon layers.

FIG. 6A is a schematic plan view of a thin film transistor. A polysilicon film 12 extends on a glass substrate in a lateral direction in FIG. 6A. A gate electrode 14 is disposed crossing the polysilicon film in a generally central area thereof. One end of the gate electrode 14 is continuous with a gate line extending in the lateral direction in FIG. 6A. The gate electrode structure 14 and gate line structure are made of a low resistance region 14b of Al and an anodic oxide film 14a surrounding the low resistance region 14b.

FIGS. 6B to 6G are cross sectional views taken along one-dot chain line VI—VI of FIG. 6A and illustrating the manufacture processes.

Figure 6E:
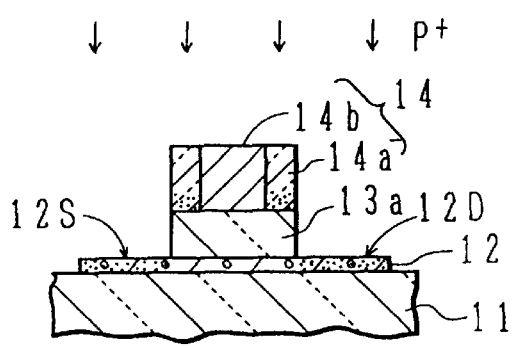
Figure 6B:
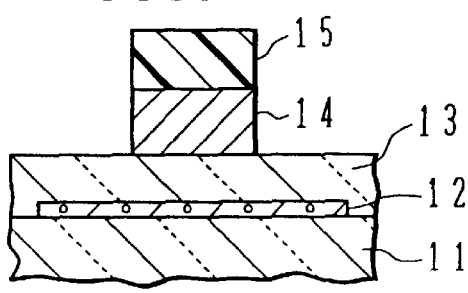

Referring to FIG. 6B, a polysilicon layer is deposited to a thickness of about 40 to 50 nm by using the method according to the above or other embodiment. This polysilicon layer is patterned to form a polysilicon layer 12. For example, the polysilicon layer is patterned through dry etching using $Cl_2$ containing gas.

A gate insulating film of $SiO_2$ having a thickness of about 120 nm is deposited on the whole surface of the substrate 11, covering the polysilicon film 12. For example, the gate insulating film 13 is deposited through PECVD using $SiH_4$ and $N_2O$.

An Al film is deposited on the gate insulating film 13 through sputtering to a thickness of about 350 nm. A resist pattern 15 is formed on the Al film, the resist pattern having the same pattern as that of the gate electrode 14 crossing the polysilicon film 12 shown in FIG. 6A. By using the resist pattern 15 as an etching mask, the Al film is patterned through dry etching using $Cl_2$ containing gas to leave a gate electrode 14 in an area covered with the resist pattern 15.

Figure 6F:
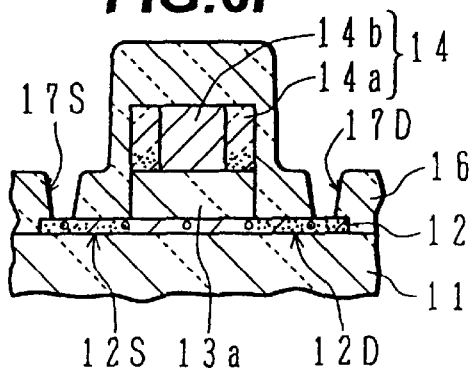
Figure 6C:
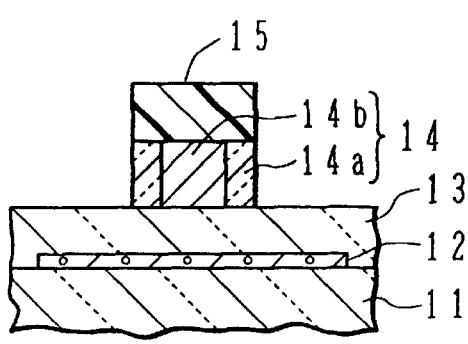

As shown in FIG. 6C, by using the resist pattern 15 as a mask, the exposed surface of the gate electrode 14 is subjected to anodic oxidation. With this anodic oxidation, the gate electrode 14 is made to have a low resistance region 14b of Al formed in the inner region of the gate electrode and an anodic oxide film 14a having a thickness of about 1 to 2 µm formed on the side wall of the low resistance region 14b. The anodic oxidation is executed in an aqueous solution of oxalic acid. After the anodic oxidation, the resist pattern 15 is removed.

Figure 6G:
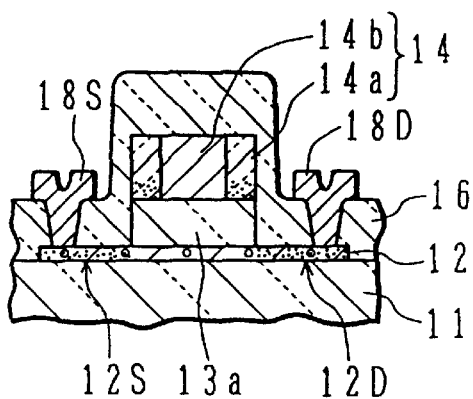
Figure 6D:
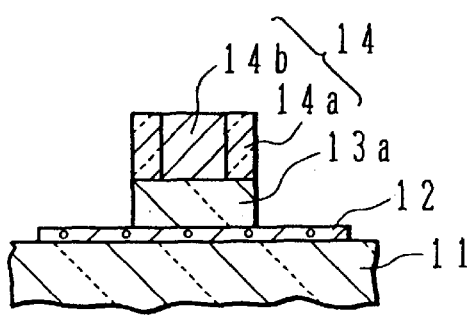

As shown in FIG. 6D, by using the gate electrode 14 as a mask, the gate insulating film 13 is etched to leave a gate insulating film 13a only just under the gate electrode 14. For example, the gate insulating film 13 is etched through dry etching using fluorine containing gas. Partial surface areas of the polysilicon film 12 are exposed on both sides of the gate insulating film 13a.

As shown in FIG. 6E, P$^+$ ions are implanted into the whole surface layer of the substrate, and activation annealing is performed by laser radiation. The dose of P$^+$ ions is determined so that the sheet resistance of the polysilicon film 12 doped with ions is set to about 1 kΩ/□ or lower. A source region 12S and a drain region 12D of n$^+$-type are formed in the regions of the polysilicon film 12 exposed on both sides of the gate insulating film 13a.

With the above processes, the gate electrode 14 is formed which has the low resistance region 14b of Al and high resistance regions 14a disposed on the source region 12S side and drain region 12D side.

As shown in FIG. 6F, an interlayer insulating film 16 is deposited over the whole substrate surface to a thickness of about 300 nm, the interlayer insulating film being formed by laminating an SiO$_2$ film having a thickness of about 30 nm and an SiN film having a thickness of about 270 nm sequentially in this order. For example, the SiO$_2$ film is deposited through PECVD at a growth temperature of 300° C. by using SiH$_4$ and N$_2$O as source gas, and the SiN film is deposited through PECVD at a growth temperature of 300° C. by using SiH$_4$ and NH$_3$ as source gas.

Contact holes 17S and 17D are formed through the interlayer insulating film 16 to expose partial surface areas of the source region 12S and drain region 12D. For example, the SiN film is etched through dry etching using fluorine containing gas, and the SiO$_2$ film is etched through wet etching using buffered hydrofluoric acid which is a mixture of NH$_4$F, HF and H$_2$O.

Referring to FIG. 6G, a Ti film having a thickness of about 50 nm and an Al film having a thickness of about 300 nm are laminated in this order over the whole substrate surface. This lamination structure is patterned to form a source lead 18S connected to the source region 12S and a drain lead 18D connected to the drain region 12D. For example, the Ti film and Al film are etched through dry etching using chlorine containing gas.

With the above processes, a thin film transistor can be formed by incorporating the silicon layer forming method according to the above or other embodiment. An off-current of this thin film transistor is smaller than a conventional thin film transistor and a mobility under an electric field is high.

If the thickness of the polysilicon layer 12 is made thinner than 30 nm, connections between the source region 12S and its lead 18S and between the drain region 12D and its lead 18D become difficult. If the thickness of the polysilicon layer 12 is made thicker than 100 nm, leak current increases. It is therefore preferable to set the thickness of the polysilicon layer 12 to 30 to 100 nm.

Figure 7:
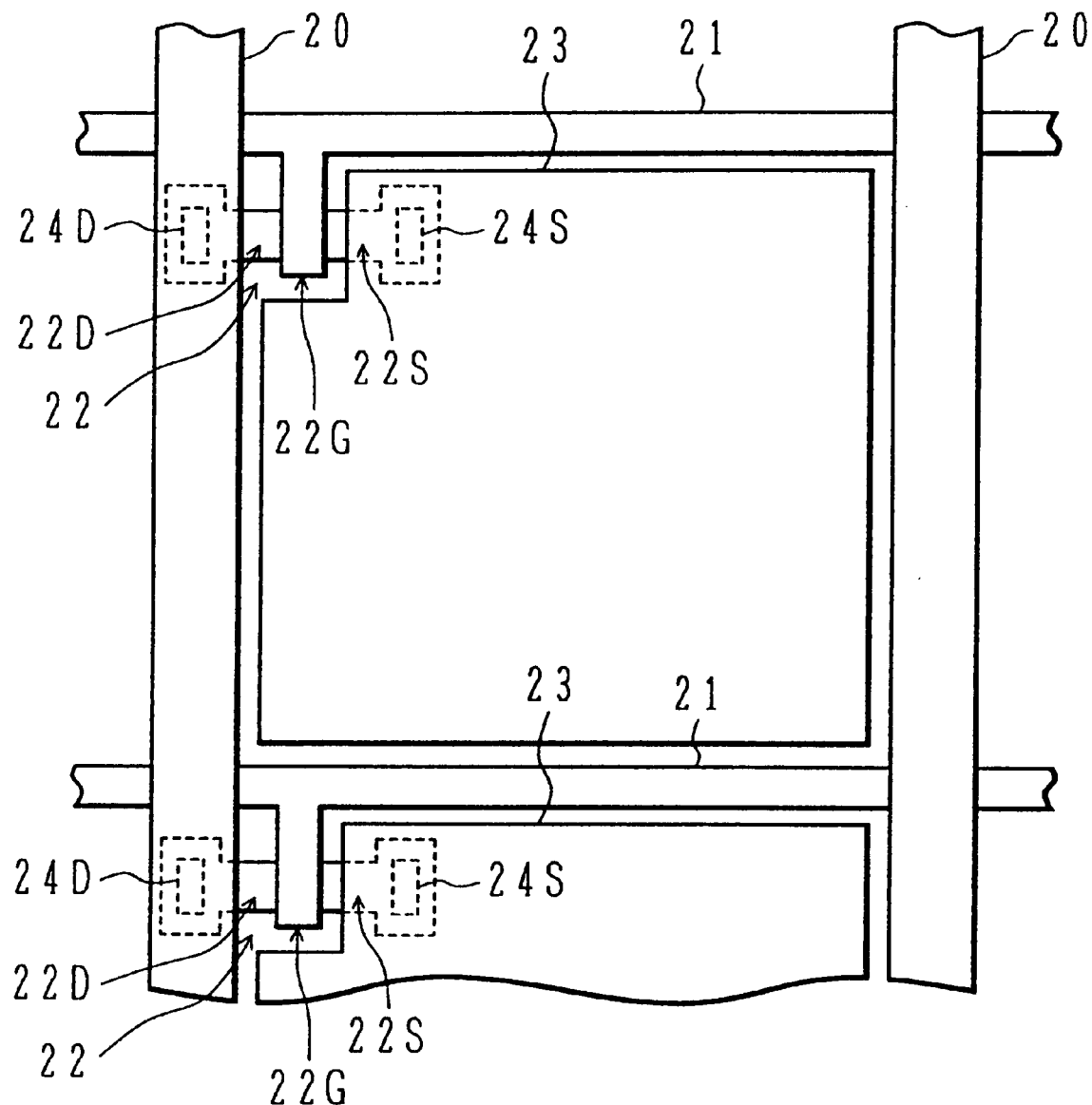
FIG. 7 is a schematic plan view showing the structure of a liquid crystal display device.

FIG. 7 is a schematic plan view of one pixel of a TFT substrate of a liquid crystal display device using TFTs shown in FIG. 6A as pixel switching elements. A plurality of signal lines 20 extending in a vertical direction in FIG. 7 and a plurality of control lines 21 extending in a horizontal direction form a lattice pattern. The signal line 20 and control line 21 are insulated at their cross point by an interlayer insulating film. A TFT 22 is disposed at the cross point of the signal line 20 and control line 21. TFTs 22 are formed by using a polysilicon layer divided into a number of island regions.

A gate electrode 22G of TFT 22 is continuous with a corresponding control line 21. A source region 22S of TFT 22 is connected via a contact hole 24S to a transparent pixel electrode 23 formed on an interlayer insulating film which covers TFT 22. A drain region 22D is connected to a corresponding signal line 20 via a contact hole 24D formed through the interlayer insulating film.

By using TFTs shown in FIG. 6A, an off-current of TFT 22 can be reduced and the display characteristics can be improved.

In the above-described embodiment, a polysilicon layer is formed by way of example. Other polycrystalline semiconductor layers may also be used. For example, a polycrystalline semiconductor layer of Ge, SiGe alloy or the like may be formed.

Figure 8:
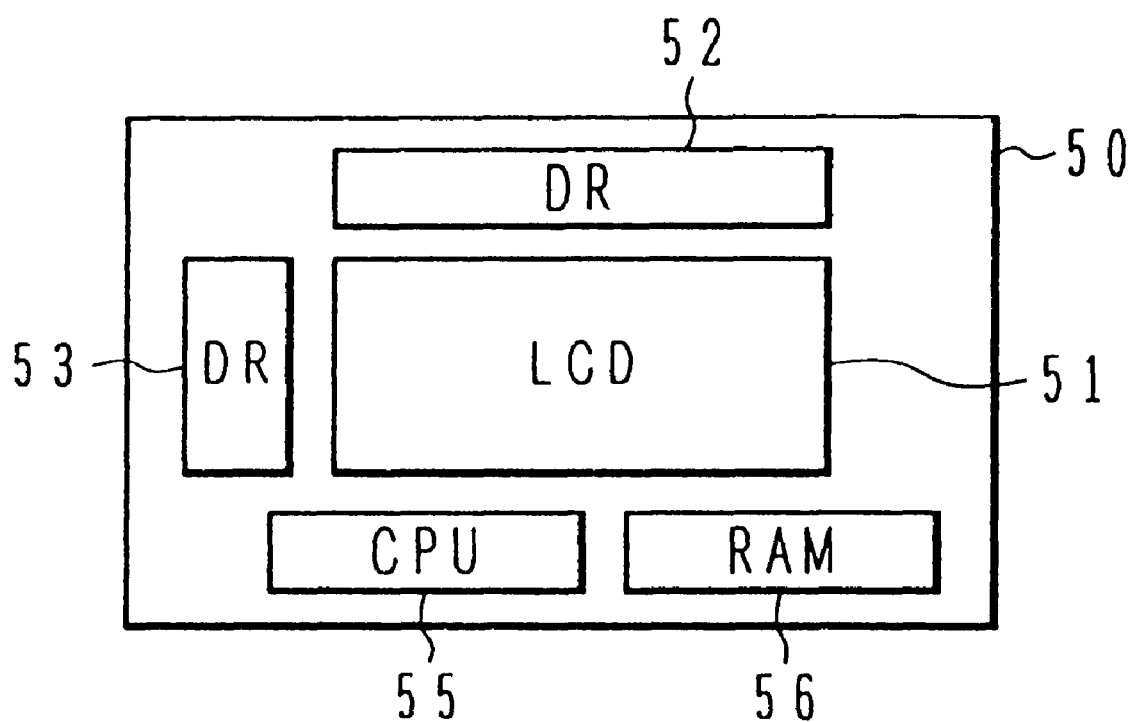
FIG. 8 is a schematic top view of a system-on-panel.

FIG. 8 shows the structure of a system-on-panel. On a glass substrate 50, a liquid crystal display (LCD) 51 similar to that shown in FIG. 7, its driver circuits (DR) 52 and 53, a CPU 55 and a RAM 56 are formed. By integrally forming an arithmetic operation circuit and a memory, a system capable of realizing desired functions can be formed on the glass substrate.

The present invention has been described in connection with the preferred embodiments. The invention is not limited only to the above embodiments. It is apparent that various modifications, improvements, combinations, and the like can be made by those skilled in the art.

What is claimed is:

1. A semiconductor device comprising:
   a base substrate including a glass substrate; and
   a polycrystalline semiconductor layer formed on said base substrate, said polycrystalline semiconductor layer having a peak of an atmospheric impurity concentration distributed throughout an entire plane of said layer at an intermediate depth within the layer, and a number of grain boundaries extending from a lower surface to an upper surface of said layer across said peak.

2. A semiconductor device according to claim 1, wherein said polycrystalline semiconductor layer is divided into a number of island regions each being formed with a semiconductor element.

3. A semiconductor device according to claim 2 wherein the semiconductor element includes a drive element of a liquid crystal display element and a constituent element of a functional circuit.

4. A semiconductor device according to claim 3, wherein the semiconductor device is a system-on-panel.

5. A semiconductor device according to claim 1, wherein said polycrystalline semiconductor layer is formed of silicon.

6. A semiconductor device according to claim 1, wherein said grain boundaries define grains extending from the lower surface to the upper surface of said layer.

7. A semiconductor device comprising:
   a base substrate including a glass substrate; and
   a polycrystalline semiconductor layer formed on said base substrate, said polycrystalline semiconductor layer consisting essentially of grains, each having a diameter in a direction parallel to the base substrate larger than a thickness, and extending from a lower surface to an upper surface of said layer, the polycrystalline semiconductor layer having a peak of an atmospheric impurity concentration distributed throughout an entire plane of said layer at an intermediate depth within the layer.

8. A semiconductor device according to claim 7, wherein said polycrystalline semiconductor layer is divided into a number of island regions each being formed with a semiconductor element.

9. A semiconductor device according to claim 8, wherein the semiconductor element includes a driver element of a liquid crystal display element and a constituent element of a functional circuit.

10. A semiconductor device according to claim 9, wherein the semiconductor device is a system-on-panel.

11. A semiconductor device according to claim 7, wherein said polycrystalline semiconductor layer is formed of silicon.

12. A semiconductor device comprising:

a base substrate including a glass substrate;

a lower polycrystalline semiconductor layer having a plurality of grains formed on said base substrate; and an upper polycrystalline semiconductor layer having a plurality of grains formed on said lower polycrystalline semiconductor layer;

wherein a peak of an atmospheric impurity concentration is distributed between said lower and upper polycrystalline semiconductor layers;

further wherein a crystal orientation of the plurality of grains of both said lower and upper polycrystalline semiconductor layers are continuously aligned.

* * * * *

UNITED STATES PATENT AND TRADEMARK OFFICE
CERTIFICATE OF CORRECTION

PATENT NO.      : 6,566,754 B2
DATED           : May 20, 2003
INVENTOR(S)     : Hara et al.

It is certified that error appears in the above-identified patent and that said Letters Patent is hereby corrected as shown below:

<u>Title page,</u>
Item [30], insert the following Foreign Application Priority Data:
-- JP10-329764, filed on November 19, 1998. --

Signed and Sealed this

Fourteenth Day of October, 2003

JAMES E. ROGAN
*Director of the United States Patent and Trademark Office*